(12) United States Patent
Ito et al.

(10) Patent No.: US 11,676,818 B2
(45) Date of Patent: Jun. 13, 2023

(54) LASER IRRADIATION APPARATUS AND METHOD FOR MANUFACTURING SEMICONDUCTOR DEVICE

(71) Applicant: JSW AKTINA SYSTEM CO., LTD., Yokohama (JP)

(72) Inventors: Daisuke Ito, Yokohama (JP); Tamotsu Odajima, Yokohama (JP); Ryo Shimizu, Yokohama (JP); Masashi Machida, Yokohama (JP); Tatsuro Matsushima, Yokohama (JP)

(73) Assignee: JSW AKTINA SYSTEM CO., LTD, Yokohama (JP)

(*) Notice: Subject to any disclaimer, the term of this patent is extended or adjusted under 35 U.S.C. 154(b) by 419 days.

(21) Appl. No.: 17/077,033

(22) Filed: Oct. 22, 2020

(65) Prior Publication Data
US 2021/0066082 A1 Mar. 4, 2021

Related U.S. Application Data

(62) Division of application No. 16/331,500, filed as application No. PCT/JP2017/025730 on Jul. 14, 2017, now Pat. No. 10,943,785.

(30) Foreign Application Priority Data

Oct. 6, 2016 (JP) .............................. JP2016-197789

(51) Int. Cl.
| H01L 21/00 | (2006.01) |
| H01L 21/20 | (2006.01) |
| B23K 26/70 | (2014.01) |
| H01L 29/66 | (2006.01) |
| B23K 26/08 | (2014.01) |

(Continued)

(52) U.S. Cl.
CPC ...... H01L 21/2003 (2013.01); B23K 26/0006 (2013.01); B23K 26/066 (2015.10);
(Continued)

(58) Field of Classification Search
CPC .............. H01L 21/2003; H01L 21/268; H01L 27/1285; H01L 29/66765; H01L 29/78603;
(Continued)

(56) References Cited

U.S. PATENT DOCUMENTS 6,028,288 A * 2/2000 Moriike ............... B23K 26/361
219/121.85
6,680,460 B1 1/2004 Takaoka et al.
(Continued)

FOREIGN PATENT DOCUMENTS

| CN | 101185988 A | 5/2008 |
| JP | H05-277776 A | 10/1993 |

(Continued)

OTHER PUBLICATIONS

International Search Report from International Patent Application No. PCT/JP2017/025730, dated Oct. 17, 2017.
(Continued)

*Primary Examiner* — Richard A Booth
(74) *Attorney, Agent, or Firm* — Potomac Law Group, PLLC

(57) ABSTRACT

A laser irradiation apparatus (1) according to an embodiment includes an optical-system module (20) configured to apply laser light (L1) to an object to be irradiated, a shield plate (51) in which a slit (54) is formed, through which the laser light (L1) passes, and a reflected-light receiving component (61) disposed between the optical-system module (20) and the shield plate (51), in which the reflected-light receiving component (61) is able to receive, out of the laser light (L1), reflected light (R1) reflected by the shield plate (51).

17 Claims, 14 Drawing Sheets

(51) Int. Cl.
  *B23K 26/12* (2014.01)
  *B23K 26/00* (2014.01)
  *B23K 26/066* (2014.01)
  *B23K 26/06* (2014.01)
  *H01L 27/12* (2006.01)
  *H10K 50/11* (2023.01)
  *H01L 21/268* (2006.01)
  *H01L 29/786* (2006.01)
  *B23K 103/00* (2006.01)
  *B23K 101/40* (2006.01)

(52) U.S. Cl.
  CPC ...... *B23K 26/0643* (2013.01); *B23K 26/0861* (2013.01); *B23K 26/125* (2013.01); *B23K 26/127* (2013.01); *B23K 26/703* (2015.10); *B23K 26/705* (2015.10); *H01L 21/268* (2013.01); *H01L 27/1285* (2013.01); *H01L 29/66765* (2013.01); *H01L 29/78603* (2013.01); *H01L 29/78663* (2013.01); *H10K 50/11* (2023.02); *B23K 2101/40* (2018.08); *B23K 2103/50* (2018.08)

(58) Field of Classification Search
  CPC . H01L 51/5012; B23K 26/066; B23K 26/703; B23K 26/705; B23K 26/0006; B23K 26/0861; B23K 26/125; B23K 26/127; B23K 2103/50; B23K 2101/40
  See application file for complete search history.

(56) References Cited

U.S. PATENT DOCUMENTS

| | | |
|---|---|---|
| 6,795,198 B1 | 9/2004 | Fuchs et al. |
| 2001/0005606 A1* | 6/2001 | Tanaka ............... G02B 19/0095 257/E27.111 |
| 2003/0024905 A1 | 2/2003 | Tanaka |
| 2005/0134825 A1 | 6/2005 | Schuster |
| 2008/0053969 A1 | 3/2008 | Omoto et al. |
| 2010/0045953 A1 | 2/2010 | Lee et al. |

FOREIGN PATENT DOCUMENTS

| | | |
|---|---|---|
| JP | 2000-343257 A | 12/2000 |
| JP | 2001-053021 A | 2/2001 |
| JP | 2003-151916 A | 5/2003 |
| JP | 2006-013227 A | 1/2006 |
| JP | 5717146 B2 | 5/2015 |
| JP | 5907530 B2 | 4/2016 |
| TW | 465114 B | 11/2001 |

OTHER PUBLICATIONS

Office Action dated Feb. 26, 2021, in Taiwanese Patent Application No. 106131389.

Office Action dated Oct. 8, 2022, in Chinese Patent Application No. 201780062257.1.

* cited by examiner

| CONFIGURATION OF REFLECTED-LIGHT RECEIVING COMPONENT | SHAPE OF LASER LIGHT (LINE BEAM) | |
|---|---|---|
| | IMMEDIATELY AFTER IRRADIATION | SEVEN HOURS OR LONGER AFTER IRRADIATION |
| COMPARATIVE EXAMPLE<br><br>WITHOUT REFLECTED-LIGHT RECEIVING COMPONENT | | ←250μm |
| FIRST EMBODIMENT<br><br>MAIN-BODY PART | | ←50μm |
| SECOND EMBODIMENT<br><br>MAIN-BODY PART<br>+<br>HEAT-INSULATING AIR LAYER<br>+<br>COOLANT CHANNEL | | ←10μm OR SMALLER |

Fig. 8

LASER IRRADIATION APPARATUS AND METHOD FOR MANUFACTURING SEMICONDUCTOR DEVICE

TECHNICAL FIELD

The present invention relates to a laser irradiation apparatus and a method for manufacturing a semiconductor device. For example, the present invention relates to a laser irradiation apparatus that irradiates an amorphous film formed over a substrate with laser light and thereby performs a laser annealing process, and a method for manufacturing a semiconductor device.

BACKGROUND ART

A laser annealing apparatus that irradiates an amorphous film formed over a silicon substrate or a glass substrate with laser light and thereby crystallizes the amorphous film has been known. Patent Literature 1 and 2 each disclose a laser annealing apparatus that blocks an edge part of laser light on a cross section orthogonal to an optical axis thereof, in which intensity decreases, by making the laser light pass through a slit, and uses the obtained laser light having uniform intensity as irradiation light.

CITATION LIST

Patent Literature

Patent Literature 1: Japanese Patent No. 5717146
Patent Literature 2: Japanese Patent No. 5907530

SUMMARY OF INVENTION

Technical Problem

In the laser annealing apparatus disclosed in Patent Literature 1 and 2, the edge part of the laser light on the cross section orthogonal to the optical axis thereof does not pass through the slit and is blocked by a shield part forming the slit. It is conceivable that the laser light blocked by the shield part is reflected by the shield part.

It is conceivable that the reflected light reflected by the shield part reaches an optical-system module of the laser annealing apparatus and thereby adversely affects the optical-system module such as raising a temperature of the optical-system module. In that case, a housing of the optical-system module is deformed by a thermal stress, causing a positional deviation of each optical element provided in the optical-system module. It is conceivable that, as a result, uneven irradiation occurs in the laser light for crystallizing the amorphous film, thus making it impossible to carry out a stable crystallizing process.

Further, reflected light of the laser light that has passed through the slit, reflected by the amorphous film or the substrate travels through the slits in the opposite direction and reaches the optical-system module. It is conceivable that, as a result, uneven irradiation occurs in a manner similar to that caused by the reflected light reflected by the shield part.

Other problems to be solved and novel features will become apparent from descriptions in this specification and accompanying drawings.

Solution to Problem

A laser irradiation apparatus according to an embodiment includes: an optical-system module configured to apply laser light to an object to be irradiated; a first shield plate in which a first slit is formed, through which the laser light passes; and a reflected-light receiving component disposed between the optical-system module and the first shield plate, in which the reflected-light receiving component is able to receive, out of the laser light, first reflected light reflected by the first shield plate.

A method for manufacturing a semiconductor device according to an embodiment includes: (A) a step of emitting laser light from an optical-system module toward a substrate on which a film including a semiconductor is formed; (B) providing a first shield plate in which a first slit is formed, through which the laser light passes, and making, out of the laser light applied to the first slit and the first shield plate, part of the laser light applied to the first slit pass through the first slit; (C) blocking, out of the laser light applied to the first slit and the first shield plate, part of the laser light applied to the first shield plate by the first shield plate; (D) disposing a reflected-light receiving component between the optical-system module and the first shield plate, and making the reflected-light receiving component receive a first reflected light, the first reflected light being light that is generated as the laser light is applied to the first shield plate and reflected by the first shield plate; and (E) irradiating the substrate with, out of the laser light applied to the first slit and the first shield plate, the laser light that has passed through the first slit.

Advantageous Effects of Invention

According to the above-described embodiment, it is possible to provide a laser irradiation apparatus and a method for manufacturing a semiconductor device capable of preventing uneven irradiation and carrying out a stable crystallizing process.

BRIEF DESCRIPTION OF DRAWINGS

FIG. 8 is an enlarged view showing examples of shapes of laser light on a substrate when being applied to the substrate;

DESCRIPTION OF EMBODIMENTS

First Embodiment

A laser irradiation apparatus according to a first embodiment is described. The laser irradiation apparatus according to this embodiment is an apparatus that applies laser light to an object to be irradiated. The object to be irradiated is, for example, a substrate on which a film including a semiconductor, such as an amorphous film, is formed. In this case, the laser irradiation apparatus performs a laser annealing process for crystallizing the amorphous film by irradiating the amorphous film with laser light. For example, when a laser annealing process is performed by using an excimer laser as the laser light, the laser irradiation apparatus is used as an excimer laser annealing (ELA: Excimer Laser Anneal) apparatus.

Figure 1:
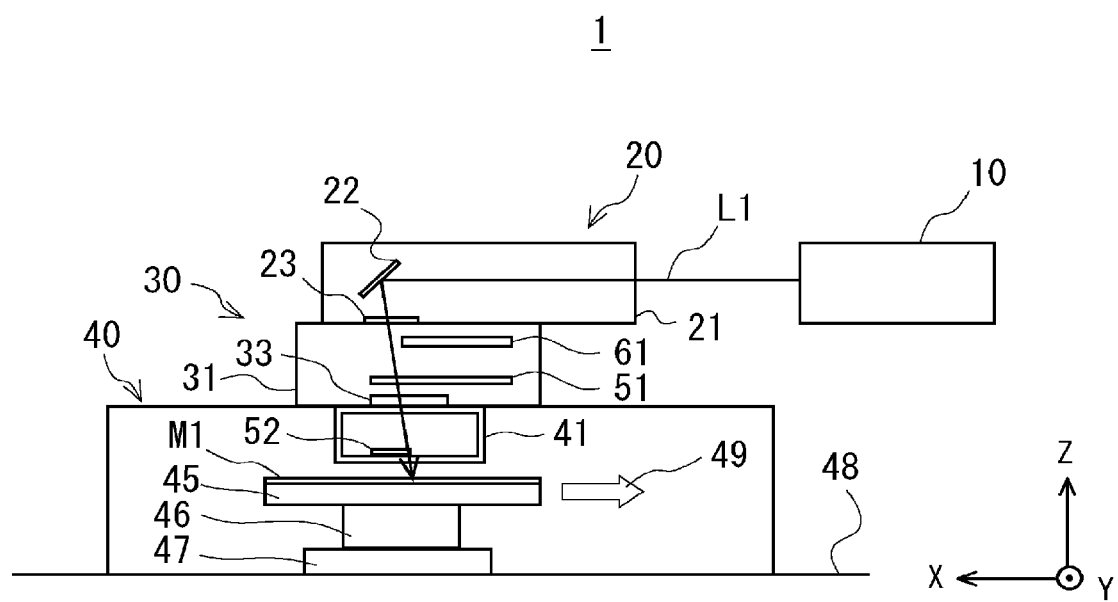
FIG. 1 is a cross section showing an example of a laser irradiation apparatus according to a first embodiment.
Figure 2:
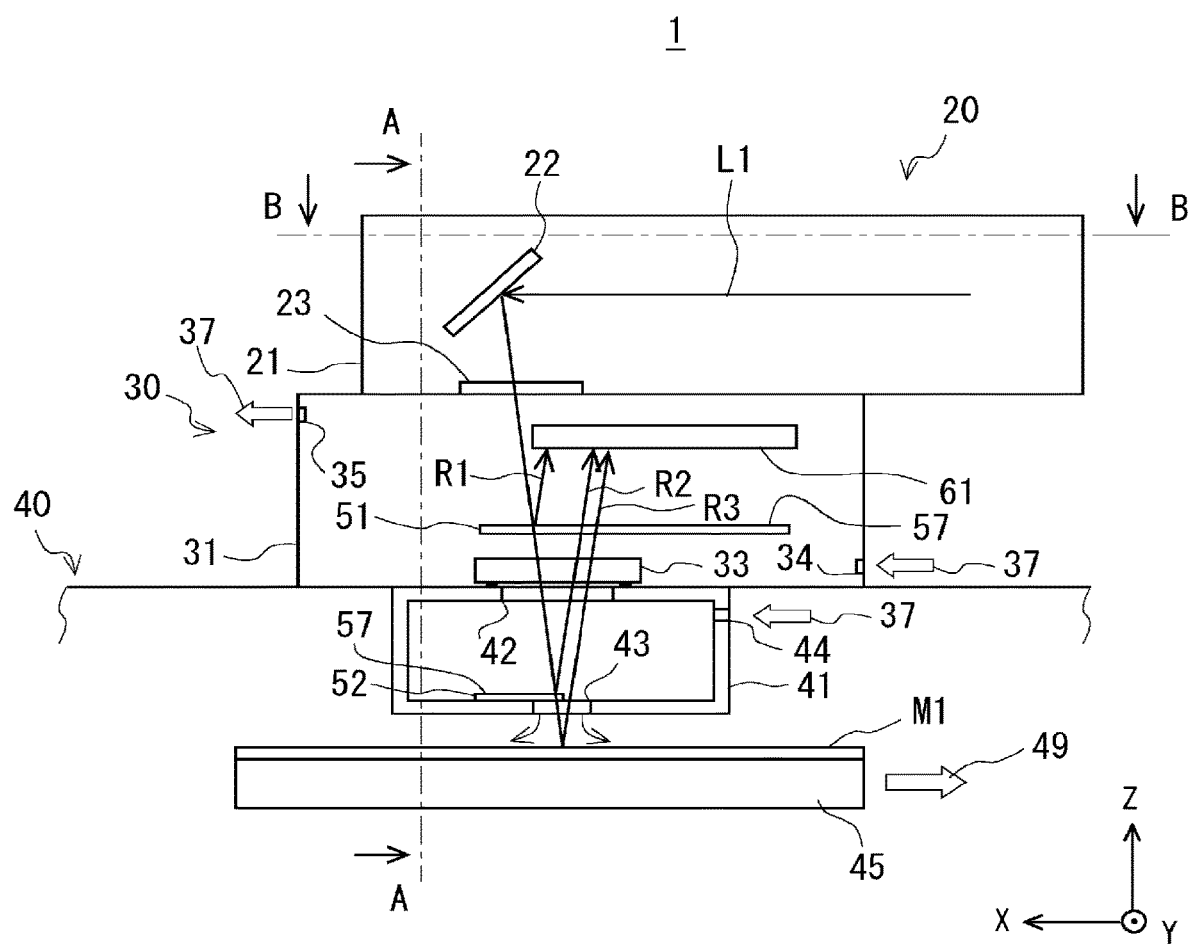
FIG. 2 is a cross section showing an example of a main part of the laser irradiation apparatus according to the first embodiment.
Figure 3:
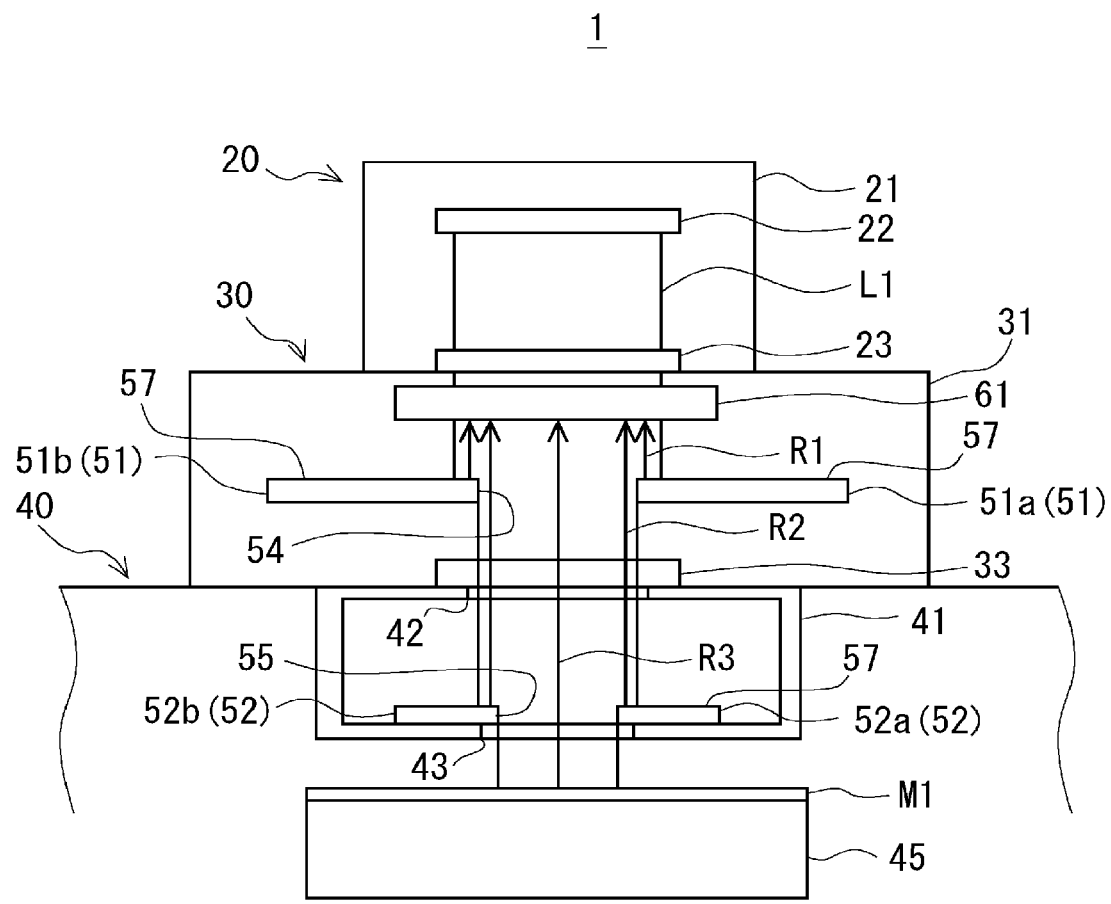
FIG. 3 is a cross section of the main part of the laser irradiation apparatus taken along a cutting line A-A in FIG. 2.
Figure 4:
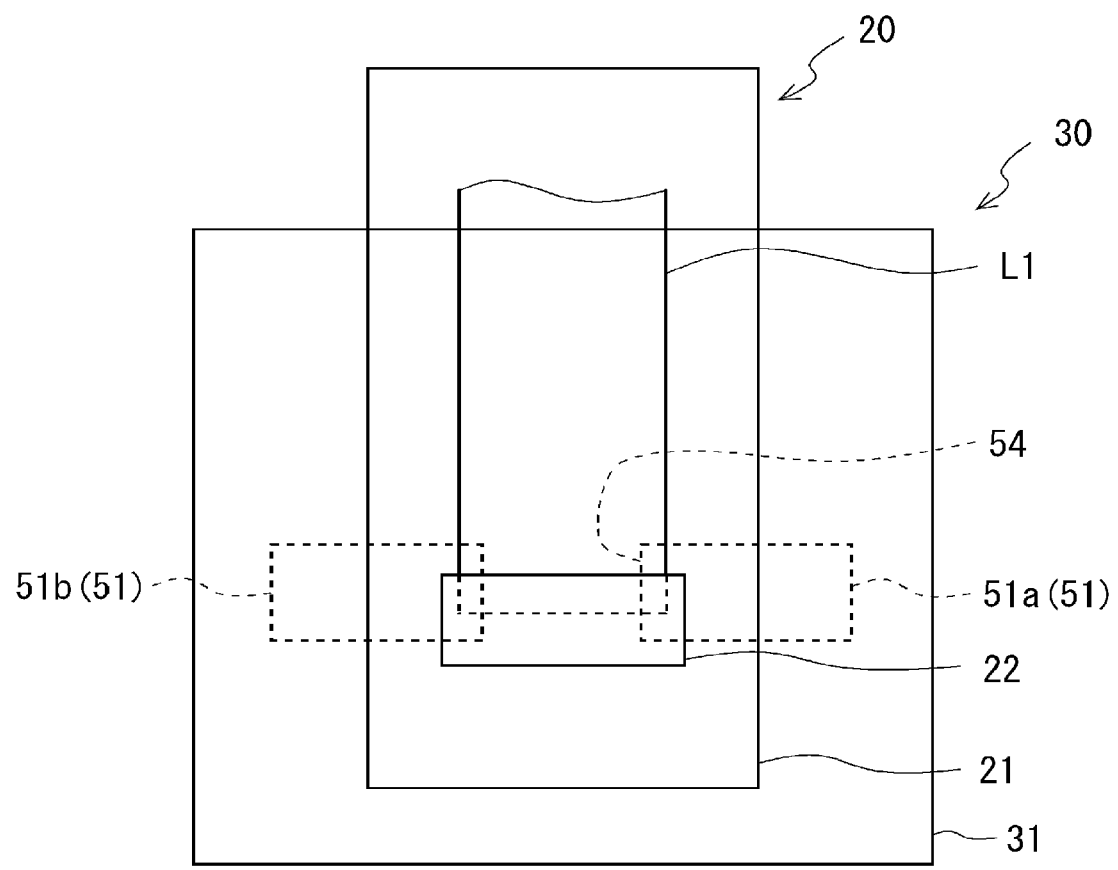
FIG. 4 is a cross section of the main part of the laser irradiation apparatus taken along a cutting line B-B in FIG. 2.
Figure 5:
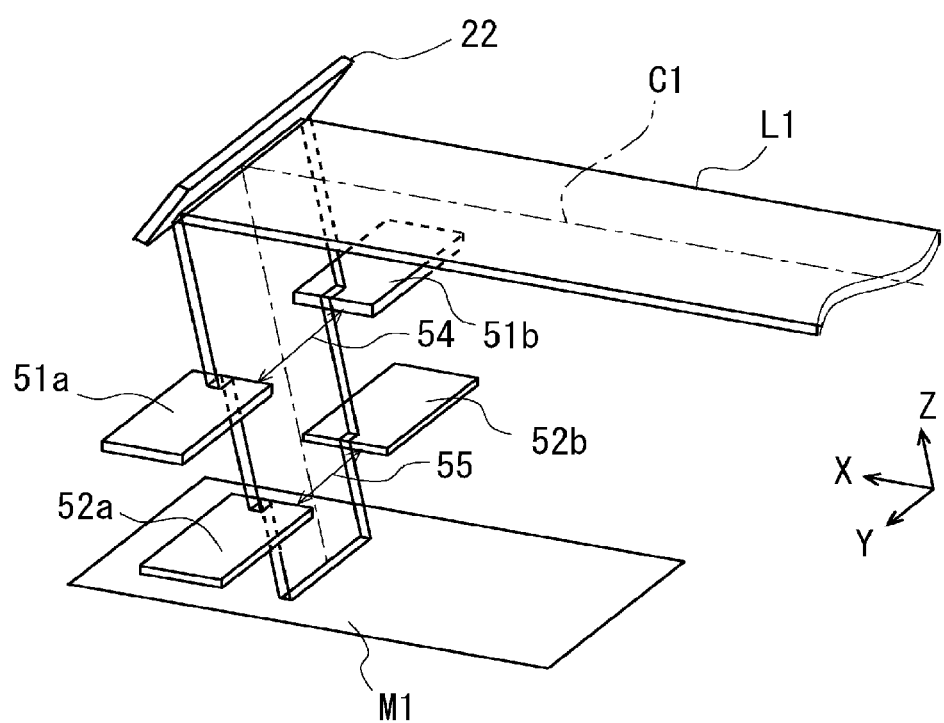
FIG. 5 is a perspective view showing an example of a relation between laser light and a slit in the laser irradiation apparatus according to the first embodiment.

Firstly, a configuration of the laser irradiation apparatus is described. FIG. 1 is a cross section showing an example of a laser irradiation apparatus according to the first embodiment. FIG. 2 is a cross section showing an example of a main part of the laser irradiation apparatus according to the first embodiment. FIG. 3 is a cross section of the main part of the laser irradiation apparatus taken along a cutting line A-A in FIG. 2. FIG. 4 is a cross section of the main part of the laser irradiation apparatus taken along a cutting line B-B in FIG. 2. FIG. 5 is a perspective view showing an example of a relation between laser light and a slit in the laser irradiation apparatus according to the first embodiment.

As shown in FIG. 1, the laser irradiation apparatus 1 includes a light source 10, an optical-system module 20, a sealed part 30, and a processing chamber 40. The processing chamber 40 is disposed, for example, over a horizontal base 48. The sealed part 30 is disposed above the processing chamber 40 and the optical-system module 20 is disposed above the sealed part 30. The optical-system module 20 is disposed in a place where it can receive laser light L1 emitted from the light source 10.

Here, XYZ orthogonal coordinate axes are introduced to explain the laser irradiation apparatus 1. A direction orthogonal to the top surface of the base 48 is defined as a Z axis direction. Further, an upward direction is defined as a +Z axis direction and a downward direction is defined as a −Z axis direction. A direction connecting the light source 10 and the optical-system module 20 is defined as an X axis direction. Further, a direction from the light source 10 toward the optical-system module 20 is defined as a +X axis direction and the opposite direction is defined as a −X axis direction. The direction orthogonal to the X axis and Z axis directions is defined as a Y axis direction. Further, one direction along the Y direction is defined as a +Y axis direction and the opposite direction is defined as a −Y axis direction.

As shown in FIG. 1, the light source 10 emits laser light L1. The light source 10 is, for example, an excimer laser light source and emits laser light L1, which is an excimer laser having a center wavelength of 308 nm. Further, the light source 10 emits pulsed laser light L1. The light source 10 emits the laser light L1 toward the optical-system module 20. For example, the laser light L1 travels in the +X axis direction and enters the optical-system module 20. Note that, if necessary, an optical element(s) for adjusting an energy density, such as an attenuator, may be disposed on an optical path of the laser light L1 between the light source 10 and the optical-system module 20.

As shown in FIGS. 1-4, the optical-system module 20 includes an optical-system housing 21 constituting an external shape thereof, a mirror 22, an optical element(s) such as a lens, and a sealing window 23. The optical-system housing 21 is, for example, a box-like component made of aluminum or the like. Each of the optical elements of the optical-system module 20 is held by a holder or the like inside the optical-system housing 21. With these optical elements, the optical-system module 20 adjusts an emitting direction, an amount, and the like of the laser light L1 emitted from the light source 10. The sealing window 23 is disposed in a part of the optical-system housing 21, e.g., over the bottom surface of the optical-system housing 21. After being adjusted by the optical-system module 20, the laser light L1 is emitted from the sealing window 23 toward the sealed part 30. In this manner, the optical-system module 20 applies the laser light L1 to an object to be irradiated.

As shown in FIG. 5, the laser light L1 is in the form of a line beam in the optical-system module 20. That is, a cross section of the laser light L1 orthogonal to an optical axis C1 thereof is an elongated linear shape extending in one direction. For example, the cross section of the laser light L1 reflected by the mirror 22 orthogonal to the optical axis thereof has a linear shape extending in the Y axis direction.

As shown in FIGS. 2 to 4, the sealed part 30 includes a sealed housing 31, a shield plate 51, a reflected-light receiving component 61, a sealing window 33, a gas inlet 34, and a gas outlet 35. For simplifying the figure, the gas inlet 34 and the gas outlet 35 are omitted in FIG. 3. Further, the reflected-light receiving component 61, the sealing window 33, the gas inlet 34, and the gas outlet 35 are omitted in FIG. 4. Note that for clarity of the description, each drawing is simplified as appropriate.

The sealed housing 31 is a box-like hollow component. The shield plate 51 and the reflected-light receiving component 61 are disposed inside the sealed housing 31. The gas inlet 34 and the gas outlet 35 are disposed on predetermined side surfaces of the sealed housing 31. The gas inlet 34 and the gas outlet 35 are disposed, for example, on opposed side surfaces of the sealed housing 31. For example, the gas outlet 35 is disposed in a position higher than the gas inlet 34. A gas 37, which is, for example, an inert gas such as nitrogen, is fed from the gas inlet 34. The gas 37 fed into the sealed housing 31 from the gas inlet 34 is discharged from the gas outlet 35. It is preferable that the gas 37 is continuously supplied into the sealed housing 31. Further, it is preferable that the gas 37 is continuously discharged to the outside of the sealed housing 31. A flow rate of the gas 37 is controlled to a predetermined flow rate so that the internal space of the sealed housing 31 is always ventilated.

As shown in FIGS. 2 to 5, the shield plate 51 is disposed on an optical path through which the laser light L1 emitted from the sealing window 23 of the optical-system module 20 reaches the processing chamber 40. The shield plate 51 includes, for example, a plurality of components. The shield plate 51 includes, for example, a shield plate 51a and a shield plate 51b. Each of the shield plates 51a and 51b is a plate-like component extending in one direction, e.g., extending in the Y axis direction. The shield plates 51a and 51b are disposed in such a manner that their plate surfaces face the Z axis direction. The shield plates 51a and 51b are arranged side by side with a space therebetween in the Y axis direction. Therefore, a slit 54 is formed between the shield plates 51a and 51b. Each of the shield plates 51a and 51b can be moved by a motor (not shown) in the +Y axis and −Y axis directions, so that a width of the slit 54 (a distance between the shield plates 51a and 51b) can be set as desired. The laser light L1 passes through the slit 54. As described above, the slit 54, through which the laser light L1 passes, is formed in the shield plate 51.

Both edges of the laser light L1 in the Y axis direction are blocked by the shield plates 51a and 51b. The edge part of the laser light L1 blocked by the shield plates 51a and 51b are reflected by the shield plates 51a and 51b and become reflected light R1. In this way, out of the laser light L1 applied to the slit 54 and the shield plate 51, part of the laser light L1 blocked by the shield plate 51 is reflected by the shield plate 51.

A reflecting mirror 57 may be provided over a surface on the optical-system module 20 side of the shield plate 51. In this way, it is possible to prevent the laser light L1 blocked by the shield plate 51 from being absorbed in the shield plate 51. Therefore, it is possible to prevent an atmosphere near the shield plate 51 from being disturbed, which would otherwise be caused by a rise in temperature of the shield plate 51. It is preferable that a reflecting film applied to the reflecting mirror 57 has been processed so as to have a predetermined tolerance for the incident angle of the laser light L1. In general, there are various reflecting films from those whose reflectance changes drastically according to the incident angle of the laser light L1 to those whose reflectance does not change much according to the incident angle of the laser light L1. In this embodiment, a reflective film whose reflectance remains within a predetermined range irrespective of changes in incident angle of the laser light L1 that could possibly occur when laser light is applied to an object to be irradiated.

The reflected-light receiving component 61 is disposed between the shield plate 51 and the optical-system module 20. For example, the reflected-light receiving component 61 is disposed outside the optical-system module 20 in such a manner that a space is formed between the reflected-light receiving component 61 and the optical-system module 20. The reflected-light receiving component 61 is, for example, a plate-like component. The reflected-light receiving component 61 is disposed in such a manner that its plate surface faces the Z axis direction. The reflected-light receiving component 61 is disposed so as to be able to receive the reflected light R1, which is generated as the laser light L1 that has been blocked by the shield plate 51 is reflected by the shield plate 51. For example, the reflected-light receiving component 61 is disposed on an optical path of the reflected light R1 while taking the incident angle of the laser light L1 and the reflection angle of the reflected light R1 into consideration. Note that the reflected-light receiving component 61 may be attached to the optical-system module 20 with a heat-insulating material interposed therebetween so that a space is formed therebetween. In this way, it is possible to maintain a heat-insulating property between the reflected-light receiving component 61 and the optical-system module 20.

The sealing window 33 is disposed in a part of the sealed housing 31, e.g., over the bottom surface of the sealed housing 31. The laser light L1 emitted from the sealing window 23 of the optical-system module 20 passes through the slit 54 between the shield plates 51. Then, the laser light L1, which has passed through the slit 54, is emitted from the sealing window 33 toward the processing chamber 40.

As shown in FIG. 1, the processing chamber 40 includes a gas box 41, a shield plate 52, a substrate stage 45, a base 46, and a scanning device 47. For example, in the processing chamber 40, the laser light L1 is applied to a substrate M1 placed over the substrate stage 45, so that a laser annealing process for crystallizing an amorphous film formed over the substrate M1 is performed. The substrate stage 45 may be a float-type stage, i.e., a stage that transports the substrate M1, which is an object to be irradiated, while levitating the substrate M1.

As shown in FIGS. 2 and 3, the gas box 41 is a box-like hollow component. The gas box 41 is disposed above the substrate stage 45 and below the sealing window 33 of the sealed part 30. An inlet window 42 is provided over the top surface of the gas box 41. The inlet window 42 is disposed so as to be opposed to the sealing window 33. Further, an irradiation window 43 is provided over the bottom surface of the gas box 41. The irradiation window 43 is disposed so as to be opposed to the amorphous film formed over the substrate M1.

A gas inlet 44 is provided in a predetermined side surface of the gas box 41. A predetermined gas 37, which is, for example, an inert gas such as nitrogen, is supplied from the gas inlet 44 into the gas box 41. The gas 37 supplied into the gas box 41 fills the internal space of the gas box 41 and then is discharged from the irradiation window 43.

The shield plate 52 is disposed on an optical path through which the laser light L1 emitted from the sealing window 33 of the sealed part 30 reaches the amorphous film formed over the substrate M1. The shield plate 52 is disposed, for example, so as to cover the irradiation window 43 inside the gas box 41.

As shown in FIGS. 3 and 5, the shield plate 52 includes, for example, a plurality of components. The shield plate 52 includes, for example, a shield plate 52a and a shield plate 52b. Each of the shield plates 52a and 52b is a plate-like component extending in one direction. The shield plates 52a and 52b are arranged so that their plate surfaces face the Z axis direction and their extending direction is in parallel with the Y direction. The shield plates 52a and 52b are arranged side by side with a space therebetween in the Y axis direction. Therefore, a slit 55 is formed between the shield plates 52a and 52b. Each of the shield plates 52a and 52b can be moved by a motor (not shown) in the +Y axis and −Y axis directions, so that a width of the slit 55 (a distance between the shield plates 52a and 52b) can be set as desired. The laser light L1 passes through the slit 55. As described above, the slit 55, through which the laser light L1 which has already passed through the slit 54 passes, is formed in the shield plate 52.

Both edges of the laser light L1 in the Y axis direction are blocked by the shield plates 52a and 52b. The edge parts of the laser light L1 blocked by the shield plates 52a and 52b are reflected by the shield plates 52a and 52b and become reflected light R2. In this way, out of the laser light L1 applied to the slit 55 and the shield plate 52, part of the laser light L1 blocked by the shield plate 52 is reflected by the shield plate 52.

The reflected-light receiving component 61 is disposed so as to be able to receive the reflected light R2, which is, out of the laser light L1 applied to the slit 55 and the shield plate 52, the part of the laser light L1 that has been blocked by the shield plate 52 and reflected by the shield plate 52.

A reflecting mirror 57 may be provided over a surface on the optical-system module 20 side of the shield plate 52. In this way, it is possible to prevent the laser light L1 blocked by the shield plate 52 from being absorbed in the shield plate 52. Therefore, it is possible to prevent an atmosphere near the shield plate 52 from being disturbed, which would otherwise be caused by a rise in temperature of the shield plate 52. It is preferable that a reflecting film included in the reflecting mirror 57 has been processed so as to have a predetermined tolerance for the incident angle of the laser light L1.

The laser light L1 that has passed through the slit 55 between the shield plates 52 is emitted from the irradiation window 43 and applied to the amorphous film formed over the substrate M1.

The substrate M1 is placed over the substrate stage 45. The substrate M1 is, for example, a semiconductor substrate such as a silicon substrate, or a quartz substrate or the like. Note that the substrate M1 is not limited to the semiconductor substrate and the quartz substrate. A film including a semiconductor, such as an amorphous film, is formed over the substrate M1. The amorphous film contains, for example, amorphous silicon (aSi). The amorphous film formed on the substrate M1 is irradiated with the laser light L1 and thereby crystallized. By crystallizing the amorphous film, for example, a crystalline film containing polysilicon (polySi) is formed over the substrate M1.

The laser light L1 applied to the amorphous film formed over the substrate M1 is reflected by the amorphous film or the substrate M1 and becomes reflected light R3. The reflected-light receiving component 61 is disposed so as to be able to receive the reflected light R3, which is generated as the laser light L1 that has been applied to the amorphous film or the substrate M1 is reflected by the amorphous film or the substrate M1.

As shown in FIG. 1, the substrate stage 45 is placed, for example, above the scanning device 47 with the base 46 interposed therebetween. The substrate stage 45 can be moved in the X axis, the Y axis, and the Z axis directions by the scanning device 47. When a laser annealing process is performed, the substrate stage 45 is transported in a transport direction 49, which is, for example, the −X axis direction, by a scanning operation performed by the scanning device 47.

Next, a laser irradiation method using the laser irradiation apparatus 1 according to the first embodiment is described.

Figure 6:
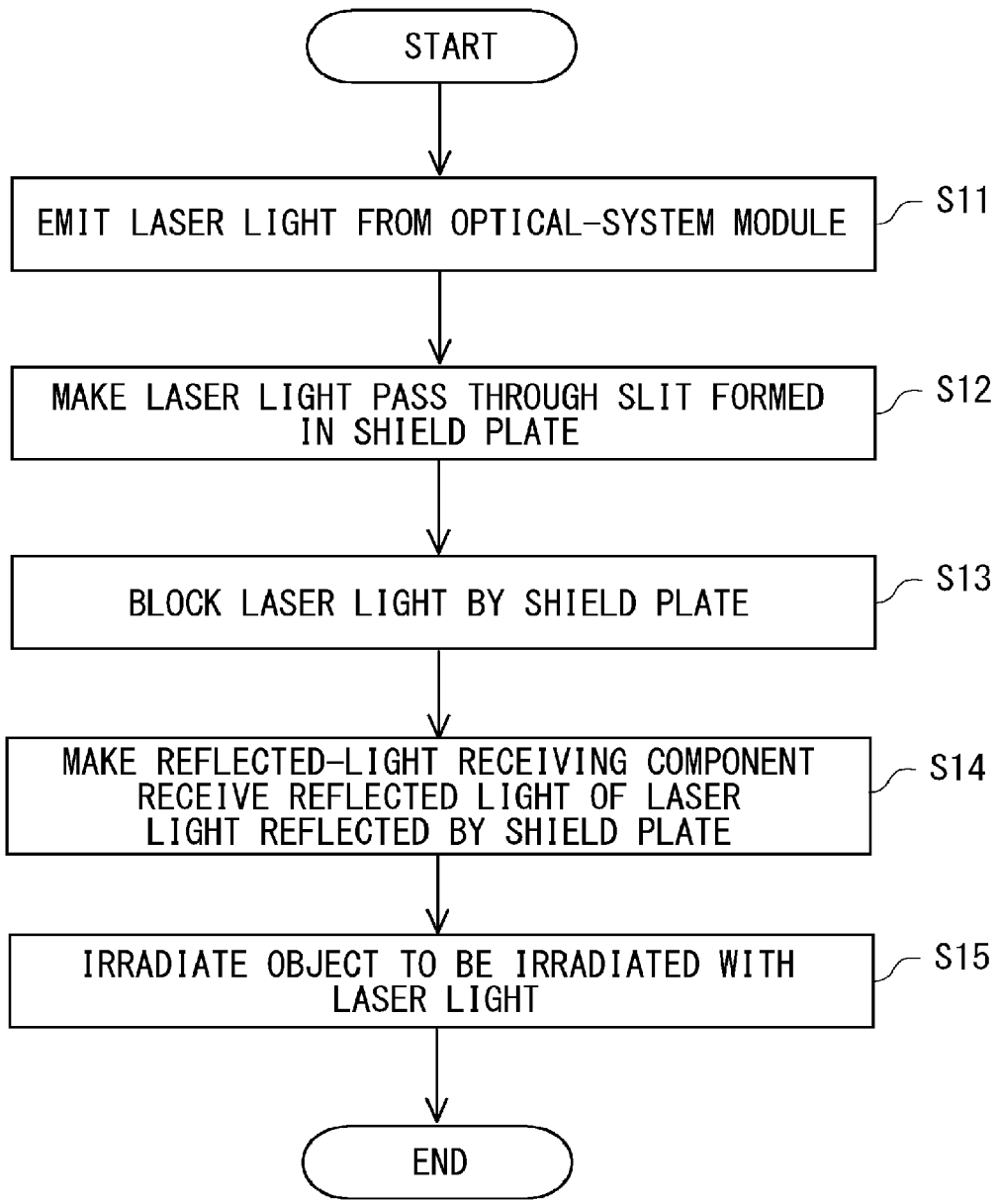
FIG. 6 is a flowchart showing an example of a laser irradiation method using the laser irradiation apparatus according to the first embodiment.

FIG. 6 is a flowchart showing an example of a laser irradiation method using the laser irradiation apparatus according to the first embodiment.

As shown in a step S11 in FIG. 6, firstly, laser light L1 is emitted from the optical-system module 20. After an emitting direction, an amount, and the like of the laser light L1 emitted from the light source 10 are adjusted by the optical-system module 20, the laser light L1 is emitted to the sealed part 30. For example, in the case where an object to be irradiated is a substrate M1 on which a film containing a semiconductor, such as an amorphous film, is formed, laser light is emitted from the optical-system module toward the substrate M1.

Next, as shown in a step S12 in FIG. 6, the laser light L1 is made to pass through the slit formed in the shield plate 51. That is, a shield plate 51 in which a slit 54 is formed, through which the laser light L1 passes, is provided and, out of the laser light L1 applied to the slit 54 and the shield plate 51, part of the laser light L1 that has been applied to the slit 54 is made to pass through the slit 54. Further, a shield plate 52 in which a slit 55 is formed is provided and, out of the laser light L1 that has passed through the slit 54 and has been applied to the slit 55 and the shield plate 52, part of the laser light L1 that has been applied to the slit 55 is made to pass through the slit 55.

Next, as shown in a step S13 in FIG. 6, out of the laser light L1 applied to the slit 54 and the shield plate 51, part of the laser light L1 that has been applied to the shield plate 51 is blocked by the shield plate 51. Further, out of the laser light L1 applied to the slit 55 and the shield plate 52, part of the laser light L1 that has been applied to the shield plate 52 is blocked by the shield plate 52. In this way, on a cross section of the laser light L1 orthogonal to an optical axis thereof, the edge part of the laser light L1 is blocked and the part of the laser light L1 other than the edge part thereof is used to irradiate the object to be irradiated.

Next, as shown in a step S14 in FIG. 6, the reflected-light receiving component 61 is made to receive reflected light R1 which is generated as the laser light L1 is reflected by the shield plate 51. That is, the reflected-light receiving component 61 is disposed between the optical-system module 20 and the shield plate 51, and the reflected-light receiving component 61 is made to receive the reflected light R1, which is generated as the laser light L1 that has been applied to the shield plate 51 is reflected by the shield plate 51. Further, the reflected-light receiving component 61 is made to receive reflected light R2 which is generated as the laser light L1 that has been applied to the shield plate 52 is reflected by the shield plate 52.

Next, as shown in a step S15 in FIG. 6, the object to be irradiated is irradiated with the laser light L1. That is, out of the laser light L1 applied to the slit 54 and the shield plate 51, the laser light L1 that has passed through the slit 54 is applied to the object to be irradiated. In the case where the object to be irradiated is a substrate on which a film containing a semiconductor, such as an amorphous film, is formed, the laser light L1 is applied to the amorphous film. Specifically, the laser light L1 is applied to the amorphous film formed over the substrate M1 while transporting the substrate M1 in a transport direction 49 of the substrate M1, which is, for example, the −X axis direction. Further, the reflected-light receiving component 61 is made to receive reflected light R3 which is generated as the laser light L1 that has been applied to the substrate M1 is reflected by the substrate M1.

In this way, it is possible to perform laser irradiation by using the laser irradiation apparatus 1 according to the first embodiment.

Next, advantageous effects of the laser irradiation apparatus 1 according to the first embodiment are described. The laser irradiation apparatus 1 according to this embodiment includes the reflected-light receiving component 61. The reflected-light receiving component 61 is disposed so as to receive the reflected light R1 reflected by the shield plate 51, the reflected light R2 reflected by the shield plate 52, and the reflected light R3 reflected by the object to be irradiated. Therefore, it is possible to prevent the reflected lights R1 to R3 from reaching the optical-system module 20. In particular, it is possible to prevent an occurrence of a positional deviation of each optical element, which would otherwise be caused as the reflected light R1 reflected by the shield plate 51 enters inside the optical-system module 20 and reaches a holder of each optical element. Therefore, it is possible to suppress a rise in temperature of the optical-system module due to the application of the reflected lights R1 to R3 and thereby to prevent the housing of the optical-system module from being deformed. As a result, it is possible to prevent the positional deviation of each optical element provided in the optical-system module and thereby to prevent uneven irradiation by the laser light.

Further, the reflected lights R1 to R3 reach one reflected-light receiving component 61. Therefore, it is possible to confine all the factors that cause a temperature gradient relative to the optical-system module 20 within, for example, the reflected-light receiving component 61, and thus making it easy to take measures for suppressing a rise in temperature of the optical-system module 20.

The reflected-light receiving component 61 is not directly attached to the optical-system module 20, but is disposed so that a space is formed between the reflected-light receiving component 61 and the optical-system module 20. In this way, it is possible to improve a heat-insulating property between the reflected-light receiving component 61 and the optical-system module 20. Further, the reflected-light receiving component 61 is attached to the optical-system module 20 with a heat-insulating material interposed therebetween so that a space is formed therebetween. In this way, it is also possible to improve the heat-insulating property between the reflected-light receiving component 61 and the optical-system module 20.

The reflected-light receiving component 61 is disposed above the sealing window 33, which is disposed above the gas box 41. Therefore, even if a temperature in the vicinity of the reflected-light receiving component 61 rises as the reflected lights R1 to R3 are received, it is possible to prevent an atmosphere in the vicinity of the substrate M1 from being disturbed because the gas box 41 is disposed between the reflected-light receiving component 61 and the substrate M1. Consequently, it is possible to prevent uneven irradiation, which would otherwise be cause by the disturbance of the atmosphere.

By providing the reflecting mirrors 57 over the surfaces on the optical-system module 20 side of the shield plates 51 and 52, it is possible to prevent the laser light L1 from being absorbed in the shield plates 51 and 52. As a result, it is possible to prevent atmospheres near the shield plates 51 and 52 from being disturbed, which would otherwise be caused by rises in temperatures of the shield plates 51 and 52. Therefore, it is possible to prevent uneven irradiation, which would otherwise be cause by the disturbance of the atmosphere. By providing the reflection mirror 57 at least on the shield plate 51, which is located close to the optical-system module 20, it is possible to suppress the uneven irradiation, which would otherwise be cause by the disturbance of the atmosphere.

A flow rate of the gas 37 is controlled so that the internal space of the sealed housing 31 is always ventilated. In this way, it is possible to suppress a rise in temperature in the atmosphere inside the sealed housing 31. Therefore, it is possible to prevent a refractive index from fluctuating, which would otherwise be caused as a fluid density changes due to a temperature gradient of the atmosphere through which the laser light L1 passes, and thereby to prevent uneven irradiation.

Comparative Example

Next, a comparative example is described. Then, an effect of suppressing an influence of heat of reflected light on a long axis of laser light will be described by comparing the comparative example with the first embodiment.

Figure 7:
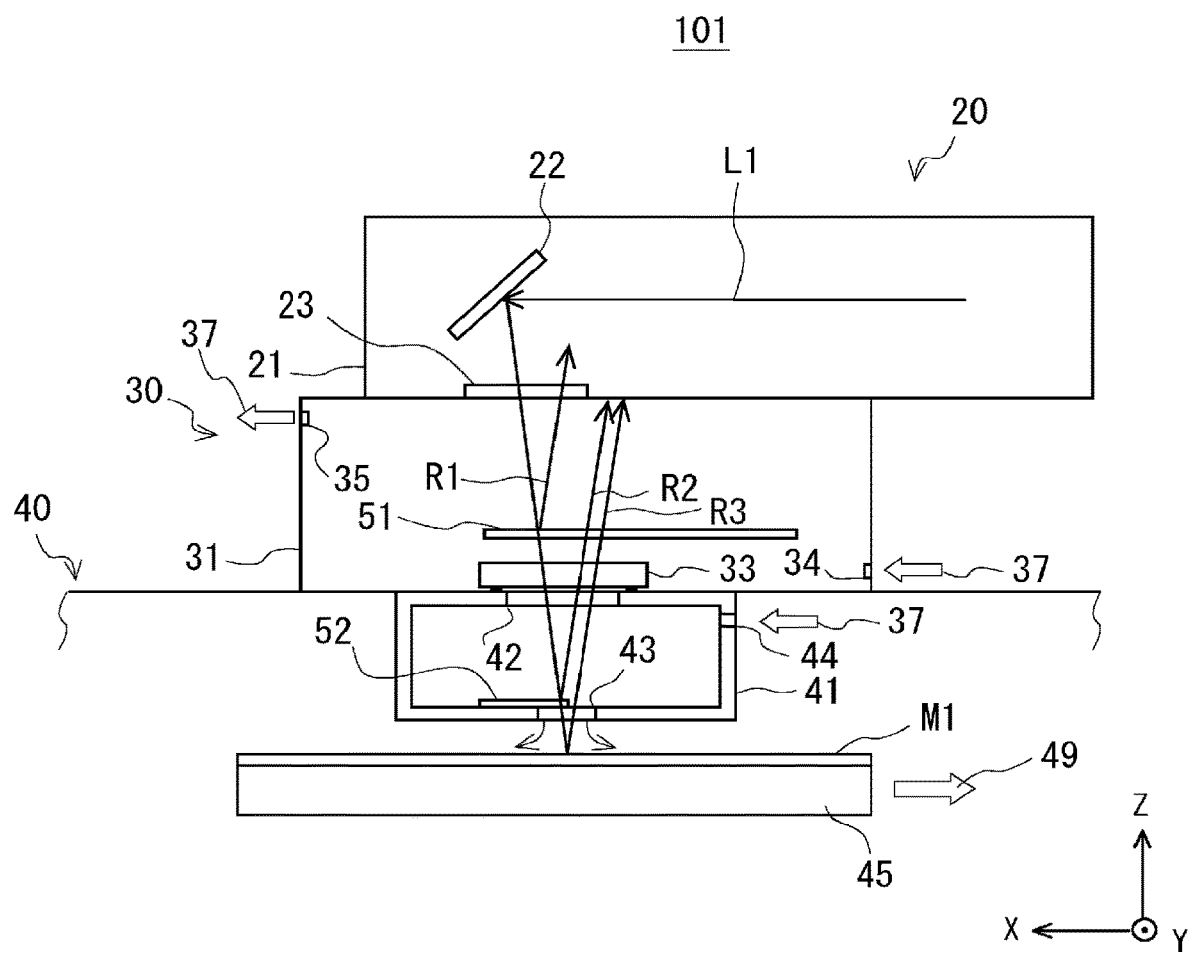
FIG. 7 is a cross section showing an example of a laser irradiation apparatus according to a comparative example.

FIG. 7 is a cross section showing an example of a laser irradiation apparatus according to a comparative example. As shown in FIG. 7, a laser irradiation apparatus 101 according to the comparative example does not include the reflected-light receiving component 61. Therefore, the reflected light R1 reflected by the shield plate 51, the reflected light R2 reflected by the shield plate 52, and the reflected light R3 reflected by the object to be irradiated reach the optical-system module 20. In particular, the reflected light R1 reflected by the shield plate 51 enters into the optical-system module 20 through the sealing window 23 and reaches a holder of each optical element. Therefore, heat of the reflected lights R1 to R3 is transmitted to the optical-system module and the holder of each optical element, and thereby raises their temperatures. As a result, the optical-system housing 21 and the holder of each optical element are deformed, thus causing a positional deviation of each optical element provided in the optical-system module 20.

(Shape of Laser Light L1 Over Substrate M1)

FIG. 8 is an enlarged view showing examples of shapes of the laser light L1 over the substrate M1 when being applied to the substrate M1. As shown in FIG. 8, regarding the configuration of the reflected-light receiving component, the comparative example includes no reflected-light receiving component and the first embodiment includes only a main-body part of the reflected-light receiving component. Note that a second embodiment will be described later.

Regarding the shape of the laser light L1 over the substrate M1, an inclination is within an error range of about 0 μm immediately after laser irradiation in the comparative example. However, when seven hours or longer has elapsed after the laser irradiation, the inclination is about 250 μm in the comparative example. That is, it is significantly inclined to such a degree that uneven irradiation occurs in the laser irradiation.

Meanwhile, regarding the shape of the laser light L1 over the substrate M1, an inclination is within an error range of about 0 μm immediately after laser irradiation in the first embodiment. When seven hours or longer has elapsed after the laser irradiation, the inclination is about 50 μm in the first embodiment. That is, the inclination is such a degree that uneven irradiation in the laser irradiation is within a permissible range.

As described above, in the first embodiment, by providing the reflected-light receiving component 61, it is possible to suppress a rise in temperature of the optical-system module 20 due to the application of the reflected lights R1 to R3 and thereby to prevent a positional deviation of each optical element provided in the optical-system module 20. Therefore, it is possible to prevent uneven irradiation by the laser light L1.

Second Embodiment

Figure 9:
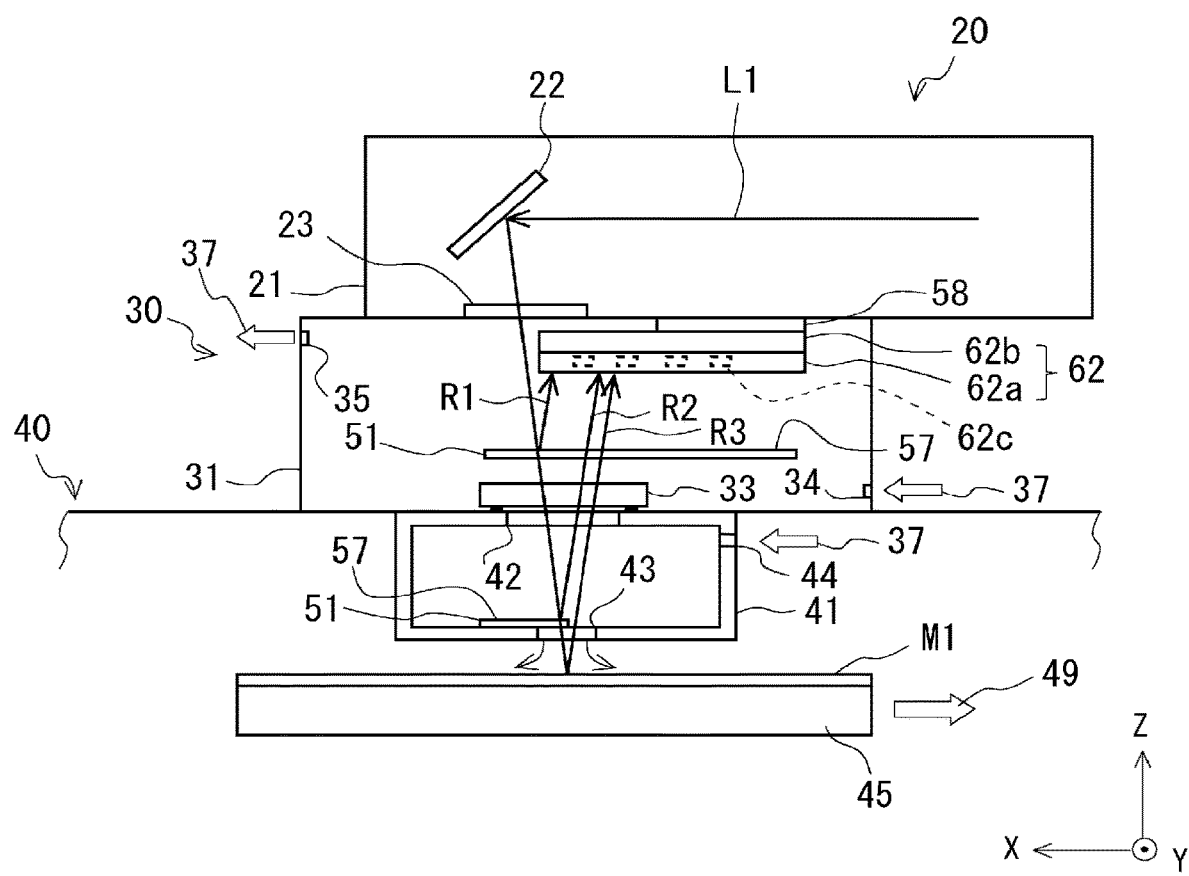
FIG. 9 is a cross section showing an example of a main part of a laser irradiation apparatus according to a second embodiment.
Figure 10:
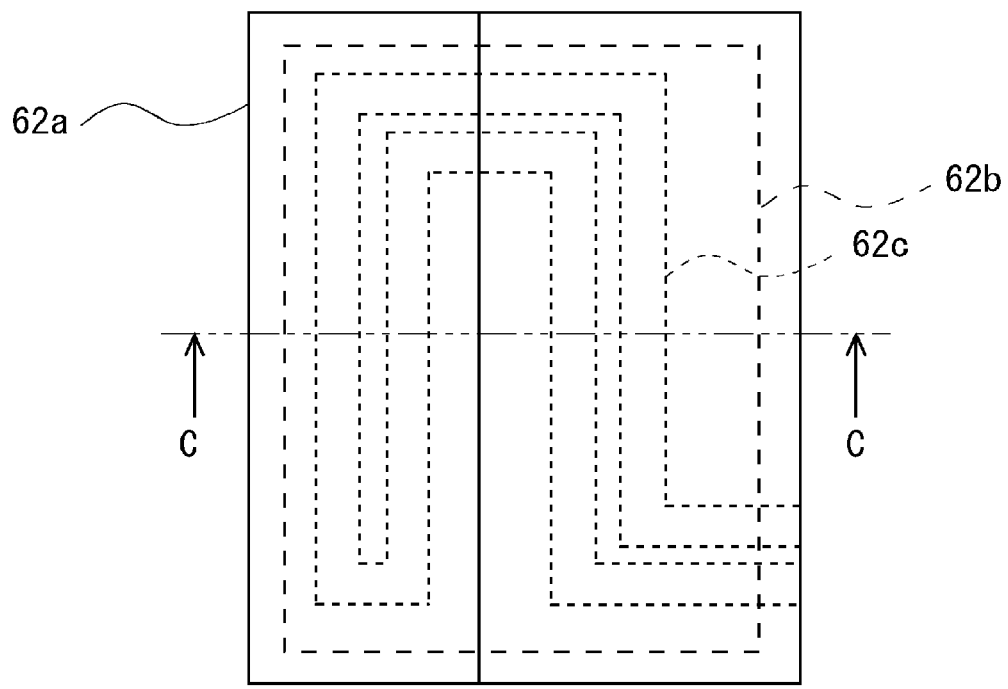
FIG. 10 is a cross section showing an example of a reflected-light receiving component according to the second embodiment.
Figure 11:
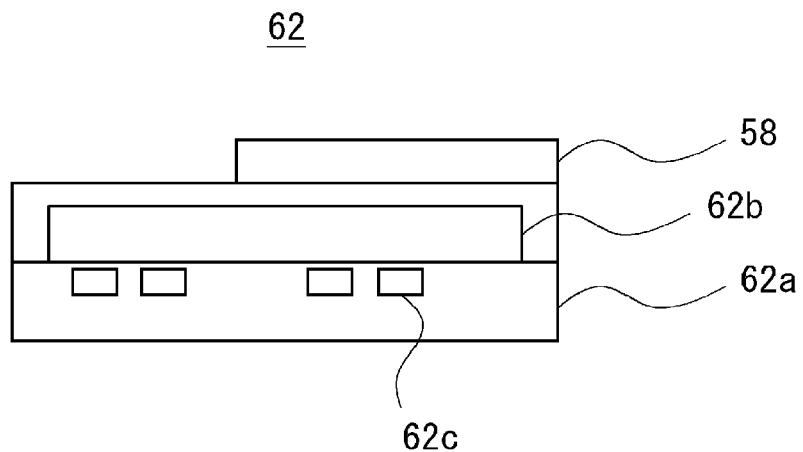
FIG. 11 is a cross section of the reflected-light receiving component taken along a cutting line C-C in FIG. 10.

Next, a laser irradiation apparatus according to a second embodiment is described. FIG. 9 is a cross section showing an example of a main part of a laser irradiation apparatus according to the second embodiment. FIG. 10 is a cross section showing an example of a reflected-light receiving component according to the second embodiment. FIG. 11 is a cross section of the reflected-light receiving component taken along a cutting line C-C in FIG. 10.

As shown in FIG. 9 to FIG. 11, in the laser irradiation apparatus 2 according to this embodiment, a reflected-light receiving component 62 is also provided between the shield plate 51 and the optical-system module 20. For example, the reflected-light receiving component 62 is attached to the optical-system module 20 with a heat-insulating material 58 interposed therebetween so that a space is formed therebetween. The reflected-light receiving component 62 is, for example, a plate-like component. The reflected-light receiving component 62 is disposed in such a manner that its plate surface faces the Z axis direction. Note that the reflected-light receiving component 62 may be disposed outside the optical-system module 20 in such a manner that a space is formed between the reflected-light receiving component 62 and the optical-system module 20, instead of being attached to the optical-system module 20 with the heat-insulating material 58 interposed therebetween. In this way, it is possible to maintain a heat-insulating property between the reflected-light receiving component 62 and the optical-system module 20.

The reflected-light receiving component 62 includes a main-body part 62a and a heat-insulating air layer 62b containing air. The main-body part 62a is disposed so as to receive reflected light R1, reflected light R2, and reflected light R3. The heat-insulating air layer 62b is disposed on the optical-system module 20 side of the main-body part 62a. For example, the main-body part 62a and the heat-insulating air layer 62b are stacked in a plate-surface direction of the reflected-light receiving component 62. An intake port (not shown) and an exhaust port (not shown) are formed in the heat-insulating air layer 62b. The internal space of the heat-insulating air layer 62b can be ventilated by supplying a predetermined gas such as air from the intake port and exhausting the gas from the exhaust port.

By using the above-described configuration, it is possible to prevent heat that is generated as the main-body part 62a receives reflected light from been transmitted to the optical-system module 20. Note that a gas other than air may be supplied to and discharged from the heat-insulating air layer 62b as long as the heat-insulating property between the reflected-light receiving component 62 and the optical-system module 20 can be improved. Further, a pressure inside the heat-insulating air layer 62b may be changed.

A coolant channel 62c through which a coolant flows is provided in the main-body part 62a of the reflected-light receiving component 62. Therefore, the reflected-light receiving component 62 includes a cooling jacket including the coolant channel 62c through which a coolant flows. For example, the coolant channel 62c is laid out so as to meander on a plane parallel to the plate surface inside the main-body part 62a. An inlet and an outlet of the coolant flowing through the coolant channel 62c are provided on side surfaces of the main-body part 62a. In this way, the coolant supplied from the inlet of the coolant channel 62c circulates through the coolant channel 62c and is discharged from the outlet of the coolant channel 62c. A temperature of the coolant is adjusted to a predetermined temperature.

The rest of the configuration of the laser irradiation apparatus 2 according to the second embodiment is similar to that of the first embodiment and therefore its description is omitted.

A laser irradiation method using the laser irradiation apparatus 2 according to the second embodiment is similar to the laser irradiation method using the laser irradiation apparatus 1 according to the first embodiment, except that the reflected-light receiving component 62 is used in place of the reflected-light receiving component 61. Further, air or the like is supplied to and discharged from the heat-insulating air layer 62b of the reflected-light receiving component 62, and a coolant is supplied to and discharged from the coolant channel 62c. The rest of the laser irradiation method is similar to that of the first embodiment and therefore its description is omitted.

Next, advantageous effects of the laser irradiation apparatus according to the second embodiment are described. The reflected-light receiving component 62 of the laser irradiation apparatus 2 according to this embodiment includes the cooling jacket. That is, the main-body part 62a includes the coolant channel 62c through which a coolant flows. Therefore, it is possible to suppress a rise in temperature of the reflected-light receiving component 62 due to heat of received reflected lights R1 to R3. As a result, it is possible to prevent the temperature of the optical-system module 20 from rising, which would otherwise be caused by radiant heat from the reflected-light receiving component 62.

As shown in FIG. 8, regarding the reflected-light receiving component, the second embodiment includes the cooling jacket (the main-body part 62a and the coolant channel 62c) and the heat-insulating air layer 62b. Regarding the shape of the laser light L1 on the substrate M1, an inclination is within an error range of about 0 µm immediately after laser irradiation in the second embodiment. When seven hours or longer has elapsed after the laser irradiation, the inclination can be kept from exceeding 10 µm in the second embodiment. That is, it is possible to keep uneven irradiation in the laser irradiation within a permissible range.

As described above, in the second embodiment, by the reflected-light receiving component 62, it is possible to suppress a rise in temperature of the optical-system module due to the application of the reflected lights R1 to R3. Therefore, it is possible to prevent a positional deviation of each optical element provided in the optical-system module and thereby to prevent uneven irradiation by the laser light.

It is possible to evacuate the internal space of the heat-insulating air layer 62b. By using the above-described configuration, it is possible to prevent heat that is generated as the main-body part 62a receives reflected light from being transmitted to the optical-system module 20. Further, the heat-insulating air layer 62b has a function of thermally insulating the optical-system module 20 from the main-body part 62a. Therefore, even when a temperature of the coolant in the coolant channel 62c is lower than that of the optical-system module 20, it is possible to prevent the temperature of the optical-system module 20 from decreasing, and thereby to prevent occurrences of positional deviations of optical elements, which would otherwise be caused by a thermal stress.

Further, the reflected lights R1 to R3 reach one reflected-light receiving component 62. Therefore, it is possible to confine all the places that are cooled by the coolant within the reflected-light receiving component 62, and thus making it easy to take measures for suppressing a rise in temperature of the optical-system module 20. Other advantageous effects are similar to those of the first embodiment and therefore their descriptions are omitted.

Third Embodiment

Figure 12:
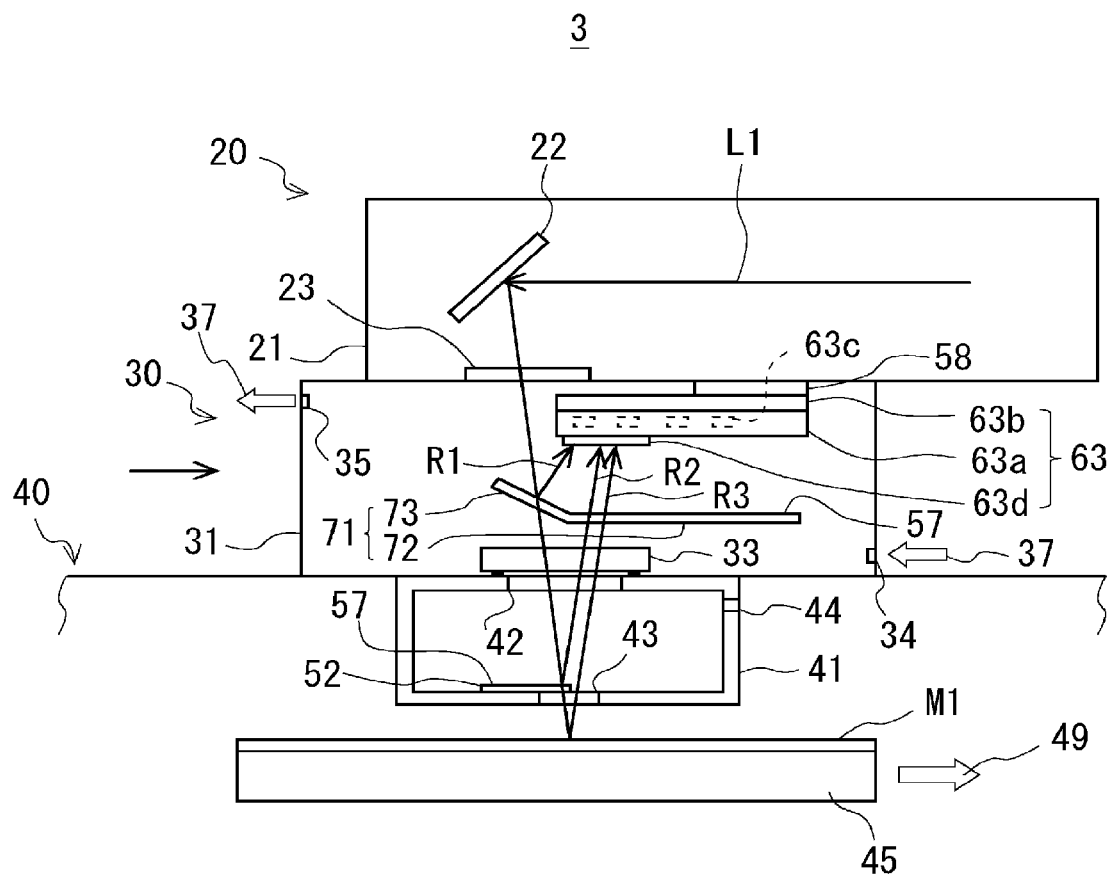
FIG. 12 is a cross section showing an example of a main part of a laser irradiation apparatus according to a third embodiment.
Figure 13:
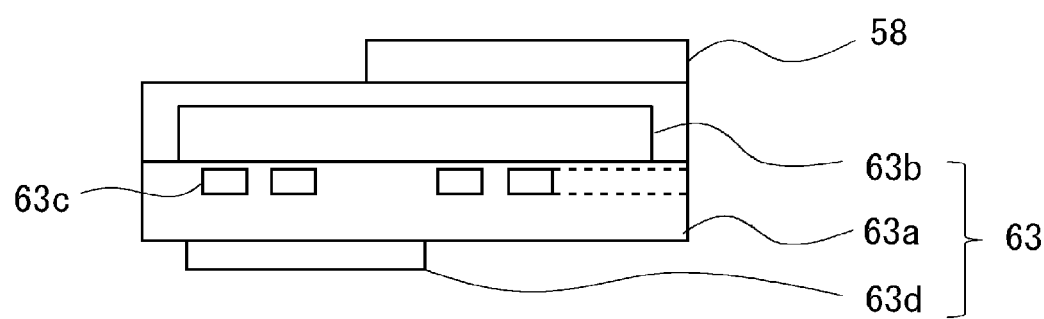
FIG. 13 is a cross section showing an example of a reflected-light receiving component according to the third embodiment.
Figure 14:
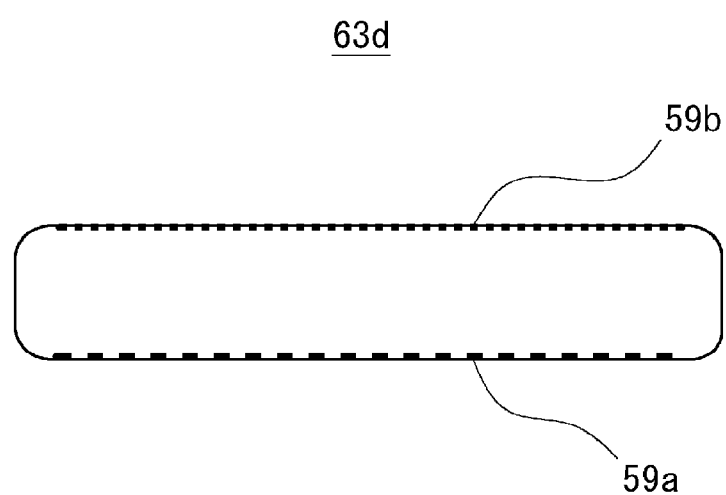
FIG. 14 is a cross section showing an example of a heat absorbing element according to a third embodiment.

Next, a laser irradiation apparatus according to a third embodiment is described. FIG. 12 is a cross section showing an example of a main part of a laser irradiation apparatus according to the third embodiment. FIG. 13 is a cross section showing an example of a reflected-light receiving component according to the third embodiment. FIG. 14 is a cross section showing an example of a heat absorbing element according to the third embodiment.

As shown in FIGS. 12 to 14, in the laser irradiation apparatus 3 according to this embodiment, a reflected-light receiving component 63 includes a heat absorbing element 63d in addition to a cooling jacket (a main-body part 63a and a coolant channel 63c) and a heat-insulating air layer 63b. Further, a shield plate 71 of the laser irradiation apparatus 3 according to this embodiment is bent toward the optical-system module 20.

The heat absorbing element 63d is disposed on the shield plate 71 side of the reflected-light receiving component 63. The heat absorbing element 63d is disposed so as to receive reflected light R1, reflected light R2, and reflected light R3. The heat absorbing element 63d is a plate-like component. The heat absorbing element 63d is attached to the main-body part 63a in such a manner that its plate surface faces the Z axis direction. Therefore, one plate surface of the heat absorbing element 63d faces the shield plate 71 side and the other plate surface thereof faces the optical-system module 20 side.

The heat absorbing element 63d is a component that absorbs heat corresponding to wavelengths of the laser light L1 and the reflected lights R1 to R3, e.g., wavelengths of excimer laser. For example, the heat absorbing element 63d is a component coated with a plurality of heat absorbing films that absorb heat. By adjusting a thickness of the heat absorbing films, the number of coating layers to be applied, and the like, it is possible to adapt the heat absorbing element 63d to the wavelength of the laser light L1.

As shown in FIG. 14, a multi-layer heat absorbing film 59a coated with a plurality of heat absorbing films that absorb heat is formed over a surface on the shield plate 71 side of the heat absorbing element 63d. It is preferable that the multi-layer heat absorbing film 59a has been processed so as to have a predetermined tolerance for the incident angles of the reflected lights R1 to R3. In general, there are various multi-layer heat absorbing films from those whose heat absorption ratio changes drastically according to the incident angle of the reflected lights R1 to R3 to those whose heat absorption ratio does not change much according to the incident angle of the reflected lights R1 to R3. In this embodiment, a multi-layer heat absorbing film whose heat absorption ratio remains within a predetermined range irrespective of changes in incident angles of the reflected lights R1 to R3. The heat absorption ratio of the multi-layer heat absorbing film 59a on the shield plate 71 side in the heat absorbing element 63d is set to, for example, 50%.

Meanwhile, a multi-layer heat absorbing film 59b is also formed on a surface on the optical-system module 20 side of the heat absorbing element 63d. For example, the heat absorption ratio of the multi-layer heat absorbing film 59b is 98%. As described above, the absorption ratio of the multi-layer heat absorbing film 59a formed over the surface on the shield plate 71 side of the heat absorbing element 63d is lower than that of the multi-layer heat absorbing film 59b formed over the surface of the optical-system module 20 side of the heat absorbing element 63d. By using the above-described configuration, heat absorbed by the heat absorbing element 63d can be easily transmitted to the main-body part 63a side. Therefore, it is possible to minimize deterioration of the heat absorbing element 63d and thereby increase a life of the heat absorbing element 63d.

Further, the heat absorbing element 63d may be one for which a frosting process has been performed over the surface on the shield plate 71 side thereof. In this way, it is possible to minimize deterioration of the multi-layer heat absorbing films 59a and 59b due to heat of the reflected lights R1 to R3.

The shield plate 71 of the laser irradiation apparatus 3 according to this embodiment is bent toward the optical-system module 20. For example, the shield plate 71 includes a horizontal part 72 and an inclined part 73.

The horizontal part 72 is a horizontal part whose plate surface faces the Z axis direction. When the shield plate 71 is disposed inside the sealed part 30, it can be fixed by the horizontal part 72. Further, the position of the shield plate 71 with respect to the optical axis of the laser light L1 can be easily adjusted by making a fine adjustment to the position of the horizontal part 72.

The inclined part 73 is a part that is inclined from the horizontal part 72 toward the optical-system module 20. The laser light L1 emitted from the optical-system module 20 is applied to the slit 54 in the inclined part 73 and the inclined part 73. Further, the shield plate 71 is disposed so that the reflected light R1, which is generated as the laser light L1 that has been applied to the inclined part 73 is reflected by the inclined part 73, is received by the heat absorbing element 63d.

As descried above, the reflected light R1 includes reflected light which is generated as the laser light L1 that has been applied to the shield plate 71 is reflected by the inclined part 73. In the part of the reflected-light receiving component 63 where the reflected light R1, the reflected light R2, and the reflected light R3 are received, the incident angle of the reflected light R1 differs from those of the reflected lights R2 and R3. The laser light L1 that has passed through the slit 54 in the inclined part 73 is emitted from the sealing window 33 toward the processing chamber 40.

The rest of the configuration of the laser irradiation apparatus 3 according to the third embodiment is similar to those of the first and second embodiments, and therefore its description is omitted.

A laser irradiation method using the laser irradiation apparatus 3 according to the third embodiment is similar to the laser irradiation method using the laser irradiation apparatus 1 according to the first embodiment, except that the reflected-light receiving component 63 is used in place of the reflected-light receiving component 61 and the shield plate 71 is used in place of the shield plate 51. Therefore, its description is omitted.

Next, advantageous effects of the laser irradiation apparatus 3 according to this embodiment are described. The reflected-light receiving component 63 according to this embodiment includes the heat absorbing element 63d. Therefore, it is possible to make the heat absorbing element 63d absorb heat generated by the reflected lights R1 to R3. In this way, it is possible to suppress a rise in temperature of the optical-system module 20 due to radiant heat from the reflected-light receiving component 63. Further, it is possible to dissipate the heat absorbed by the heat absorption element 63d by a coolant flowing through the coolant channel 63c. Therefore, it is possible to reduce the radiant heat from the reflected-light receiving component 63 and thereby further suppress the rise in temperature of the optical-system module 20. In this way, it is possible to prevent a positional deviation of each optical element provided in the optical-system module and thereby to prevent uneven irradiation by the laser light.

The multi-layer heat absorbing film 59a has been processed so as to have a predetermined tolerance for the incident angles of the reflected lights R1 to R3. Therefore, it is possible to absorb the heat generated by the reflected lights R1 to R3 irrespective of the incident angles of the reflected lights R1 to R3.

The absorption ratio of the multi-layer heat absorbing film 59*a* is made smaller than that of the multi-layer heat absorbing film 59*b*. In this way, it is possible to improve durability of the heat absorbing element 63*d* and thereby increase a life thereof.

The shield plate 71 is bent toward the optical-system module 20. In this way, it is possible to bring a place where the reflected light R1 reflected by the shield plate 71 is received closer to a place where the reflected lights R2 and R3 are received in the reflected-light receiving component 63. Dependent on the case, it is possible to receive these lights in the same place. Therefore, it is possible to arrange all the places to be cooled in a small area and thereby to make the cooling process easier. Further, since all the places to be cooled can be arranged in a small area, the size of the heat absorbing element 63*d* can be reduced. Other advantageous effects are similar to those of the first and second embodiments and therefore their descriptions are omitted.

Fourth Embodiment: Method for Manufacturing Semiconductor Device

Next, a method for manufacturing a semiconductor device by using the above-described laser irradiation apparatus is described. In this embodiment, by using the laser irradiation apparatus as a laser annealing apparatus, it is possible to crystallize an amorphous film formed over a substrate by applying laser light to the amorphous film. For example, the semiconductor device is a semiconductor device including TFTs (Thin Film Transistors). In this case, it is possible to form a polysilicon film by applying laser light to an amorphous silicon film and thereby crystallizing the amorphous silicon film.

Figure 15:
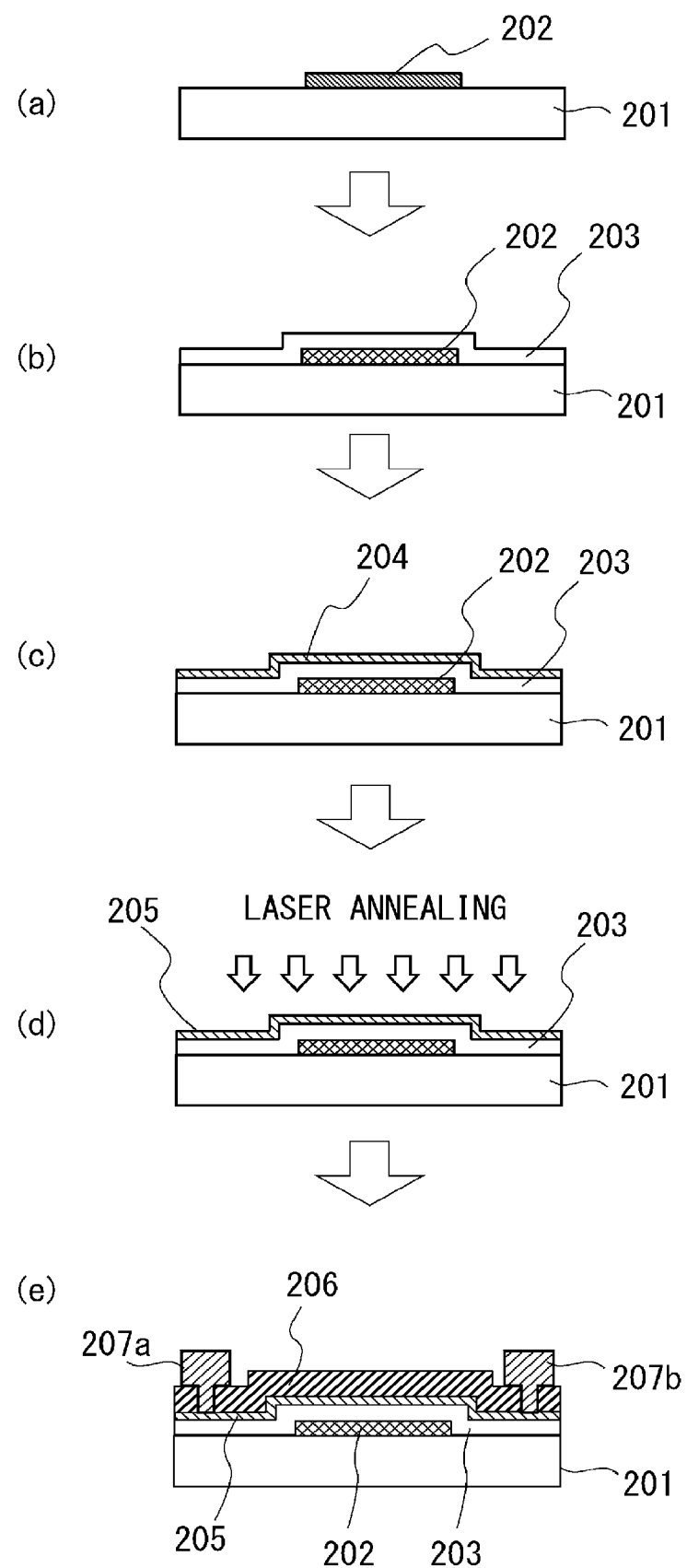
FIG. 15 is a cross section showing an example of a method for manufacturing a semiconductor device according to a fourth embodiment.

FIGS. 15(*a*) to 15(*e*) are cross sections for explaining an example of a method for manufacturing a semiconductor device according to a fourth embodiment. The laser irradiation apparatus according to the above-described embodiment is suitable for manufacturing a TFT array substrate. A method for manufacturing a semiconductor device including a TFT is described hereinafter.

Firstly, as shown in FIG. 15(*a*), a gate electrode 202 is formed over a glass substrate 201. For example, a metal thin film containing aluminum or the like can be used for the gate electrode 202. Next, as shown in FIG. 15(*b*), a gate insulating film 203 is formed over the gate electrode 202. The gate insulating film 203 is formed so as to cover the gate electrode 202. After that, as shown in FIG. 15(*c*), an amorphous silicon film 204 is formed over the gate insulating film 203. The amorphous silicon film 204 is disposed so as to be placed over the gate electrode 202 with the gate insulating film 203 interposed therebetween.

The gate insulating film 203 is, for example, a silicon nitride film ($SiN_x$), a silicon oxide film ($SiO_2$ film), or a laminated film thereof. Specifically, the gate insulating film 203 and the amorphous silicon film 204 are successively formed by a CVD (Chemical Vapor Deposition) method.

Then, as shown in FIG. 15(*d*), a polysilicon film 205 is formed by applying laser light to the amorphous silicon film 204 by using the laser irradiation apparatus described above in the first to third embodiments and thereby crystallizing the amorphous silicon film 204. As a result, the polysilicon film 205 in which silicon is crystallized is formed over the gate insulating film 203.

In this process, it is possible to suppress a rise in temperature of the optical-system module 20 and thereby to prevent uneven irradiation by the laser light L1 by using the laser irradiation method using the laser irradiation apparatus according to the above-described first to third embodiments. Therefore, it is possible to form a uniformly-crystallized polysilicon film 205.

After that, as shown in FIG. 15(*e*), an inter-layer insulating film 206, a source electrode 207*a*, and a drain electrode 207*b* are formed over the polysilicon film 205. The inter-layer insulating film 206, the source electrode 207*a*, and the drain electrode 207*b* can be formed by an ordinary photo-lithography method or an ordinary film forming method.

It is possible to manufacture a semiconductor device including TFTs by using the above-described method for manufacturing a semiconductor device. Note that the subsequent manufacturing process will vary depending on the device that is eventually manufactured, and therefore its description is omitted.

(Organic EL Display)

Figure 16:
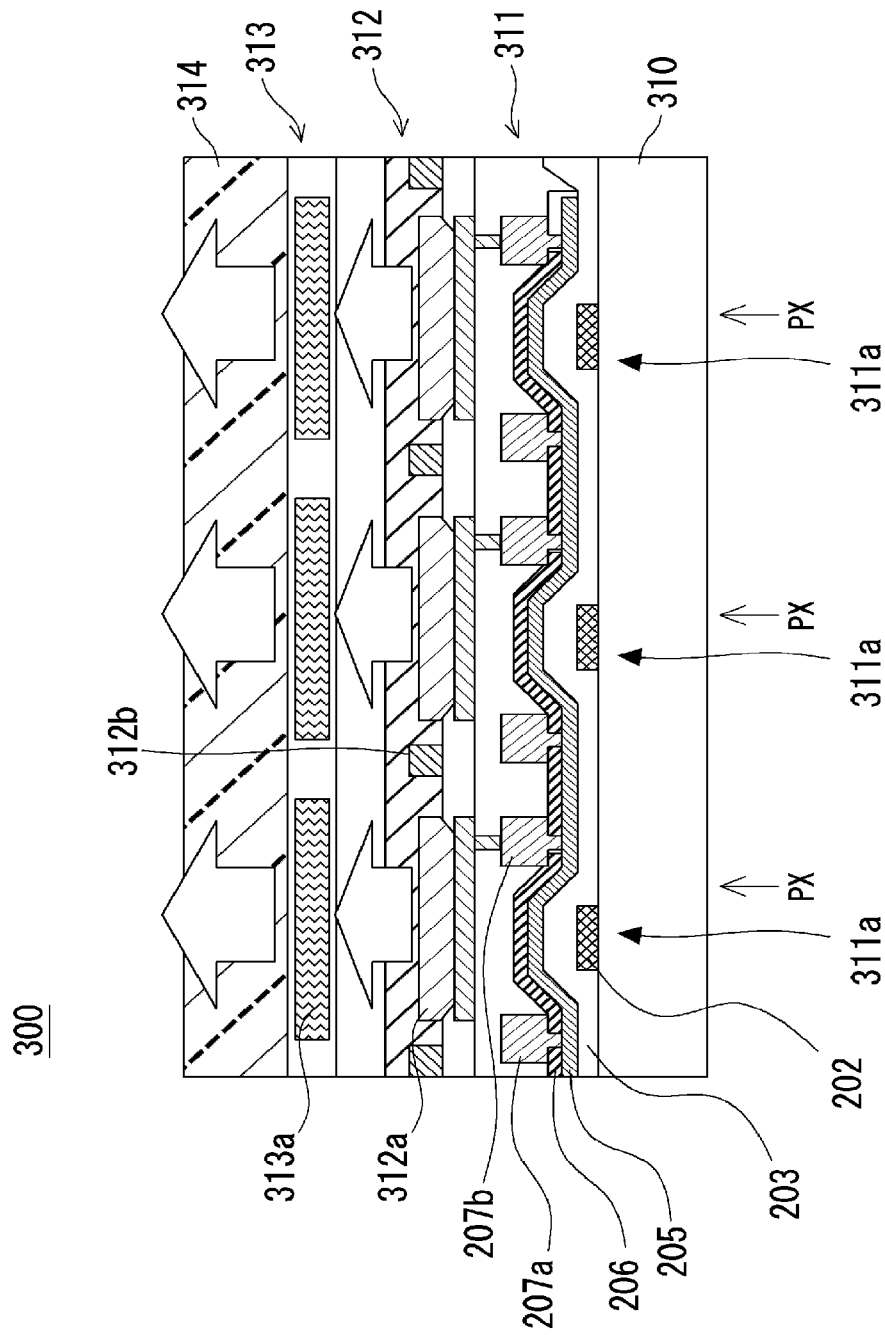
FIG. 16 is a cross section for explaining an outline of an organic EL display, in which pixel circuits of the organic EL display are shown in a simplified manner.

Next, as an example of a device using a semiconductor device including TFTs, an organic EL display device is described. FIG. 16 is a cross section for explaining an outline of an organic EL display device, in which pixel circuits of the organic EL display device are illustrated in a simplified manner. The organic EL display device 300 shown in FIG. 16 is an active-matrix-type display device in which a TFT is disposed in each pixel PX.

The organic EL display device 300 includes a substrate 310, a TFT layer 311, an organic layer 312, a color filter layer 313, and a sealing substrate 314. FIG. 16 shows a top-emission-type organic EL display device, in which the side of the sealing substrate 314 is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided over the substrate 310. The TFT layer 311 includes TFTs 311*a* disposed in the respective pixels PX. Further, the TFT layer 311 includes wiring lines connected to the TFTs 311*a*, and the like. The TFTs 311*a*, the wirings, and the like constitute pixel circuits. Note that the TFT layer 311 corresponds to the TFT described above with reference to FIG. 16, and includes gate electrodes 202, a gate insulating film 203, a polysilicon film 205, an inter-layer insulating film 206, source electrodes 207*a*, and drain electrodes 207*b*.

The organic layer 312 is provided over the TFT layer 311. The organic layer 312 includes an organic EL light-emitting element 312*a* disposed in each pixel PX. The organic EL light-emitting element 312*a* has, for example, a laminated structure in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312*b* for separating organic EL light-emitting elements 312*a* are provided between pixels PX.

The color filter layer 313 is provided over the organic layer 312. The color filter layer 313 includes color filters 313*a* for performing color displaying. That is, in each pixel PX, a resin layer colored in R (red), G (green), or B (blue)

is provided as the color filter 313a. When white light emitted from the organic layer 312 passes through the color filters 313a, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided over the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel PX by supplying a display signal corresponding to a display image to each pixel PX. As a result, it is possible to display a desired image.

Note that although the organic EL display device has been described above as an example of a device using a semiconductor device including TFTs, the semiconductor device including TFTs may be other types of display devices such as a liquid crystal display device. Further, cases where the laser irradiation apparatus according to this embodiment is applied to a laser annealing apparatus have been described above. However, the laser irradiation apparatus according to this embodiment can also be applied to apparatuses other than the laser annealing apparatus.

The present invention made by the inventors of the present application has been explained above in a concrete manner based on embodiments. However, the present invention is not limited to the above-described embodiments, and needless to say, various modifications can be made without departing from the spirit and scope of the present invention.

Further, the configurations of the above-described embodiments may be exchanged among them. For example, the shield plate 71 in the third embodiment may be applied to the laser irradiation apparatus 1 according to the first embodiment.

This application is based upon and claims the benefit of priority from Japanese patent application No. 2016-197789, filed on Oct. 6, 2016, the disclosure of which is incorporated herein in its entirety by reference.

REFERENCE SIGNS LIST 1, 101 LASER IRRADIATION APPARATUS
10 LIGHT SOURCE
20 OPTICAL-SYSTEM MODULE
21 OPTICAL-SYSTEM HOUSING
22 MIRROR
23 SEALING WINDOW
30 SEALED PART
31 SEALED HOUSING
33 SEALING WINDOW
34 GAS INLET
35 GAS OUTLET
37 GAS
40 PROCESSING CHAMBER
41 GAS BOX
42 INTRODUCTION WINDOW
43 IRRADIATION WINDOW
44 GAS INLET
45 SUBSTRATE STAGE
46 BASE
47 SCANNING DEVICE
48 HORIZONTAL BASE
49 TRANSPORT DIRECTION
51, 51a, 51b SHIELD PLATE
52, 52a, 52b SHIELD PLATE
54 SLIT
55 SLIT
57 REFLECTING MIRROR
58 HEAT INSULATING MATERIAL
59a, 59b MULTI-LAYER HEAT ABSORBING FILM
61, 62, 63 REFLECTED-LIGHT RECEIVING COMPONENT
62a, 63a MAIN-BODY PART
62b, 63b HEAT INSULATING AIR LAYER
62c, 63c COOLANT CHANNEL
63d HEAT ABSORBING ELEMENT
71 SHIELD PLATE
72 HORIZONTAL PART
73 INCLINED PART
201 GLASS SUBSTRATE
202 GATE ELECTRODE
203 GATE INSULATING FILM
204 AMORPHOUS SILICON FILM
205 POLYSILICON FILM
206 INTER-LAYER INSULATING FILM
207a SOURCE ELECTRODE
207b DRAIN ELECTRODE
300 ORGANIC EL DISPLAY DEVICE
310 SUBSTRATE
311 TFT LAYER
311a TFT
312 ORGANIC LAYER
312a ORGANIC EL LIGHT EMITTING ELEMENT
312b SEPARATION WALL
313 COLOR FILTER LAYER
313a COLOR FILTER
314 SEALING SUBSTRATE
C1 OPTICAL AXIS
L1 LASER LIGHT
M1 SUBSTRATE
R1 REFLECTED LIGHT
R2 REFLECTED LIGHT
R3 REFLECTED LIGHT

The invention claimed is:

1. A laser irradiation apparatus comprising:
an optical-system module configured to apply laser light to an object to be irradiated;
a first shield plate in which a first slit is formed, through which the laser light passes; and
a reflected-light receiving component disposed between the optical-system module and the first shield plate,
wherein the reflected-light receiving component is positioned so as to receive, out of the laser light, first reflected light reflected by the first shield plate, and
wherein the first shield plate is bent toward the optical-system module.

2. The laser irradiation apparatus according to claim 1, further comprising:
a second shield plate in which a second slit is formed, through which the laser light that has passed through the first slit passes,
wherein the reflected-light receiving component is further configured to receive, out of the laser light, second reflected light reflected by the second shield plate.

3. The laser irradiation apparatus according to claim 1, wherein the reflected-light receiving component receives third reflected light, the third reflected light being light that is generated as the laser light that has been applied to the object to be irradiated is reflected by the object to be irradiated, and wherein an incident angle of the first reflected light differs from an incident angle of the third reflected light in a part of the reflected-light receiving component where the first and third reflected lights are received.

4. The laser irradiation apparatus according to claim 1, wherein the reflected-light receiving component comprises a cooling jacket comprising a coolant channel through which a coolant flows.

5. The laser irradiation apparatus according to claim 1, wherein the reflected-light receiving component comprises a heat-insulating air layer disposed on an optical-system module side, the heat-insulating air layer containing air.

6. The laser irradiation apparatus according to claim 1, wherein the reflected-light receiving component comprises a heat absorbing element disposed on a first shield plate side, the heat absorbing element being adapted to absorb heat.

7. The laser irradiation apparatus according to claim 6, wherein a multi-layer heat absorbing film is formed over a surface on the first shield plate side of the heat absorbing element, the multi-layer heat absorbing film comprising a plurality of heat absorbing films adapted to absorb heat.

8. The laser irradiation apparatus according to claim 7, wherein the multi-layer heat absorbing film has a predetermined tolerance for an incident angle of the first reflected light.

9. The laser irradiation apparatus according to claim 6, wherein a frosting process has been performed over a surface on the first shield plate side of the heat absorbing element.

10. The laser irradiation apparatus according to claim 7, wherein a multi-layer heat absorbing film is formed over a surface on an optical-system module side of the heat absorbing element, the multi-layer heat absorbing film comprising a plurality of heat absorbing films adapted to absorb heat.

11. The laser irradiation apparatus according to claim 10, wherein an absorption ratio of the multi-layer heat absorbing film formed over the surface on the first shield plate side of the heat absorbing element and comprising the plurality of heat absorbing films adapted to absorb heat is lower than that of the multi-layer heat absorbing film formed over the surface of the optical-system module side of the heat absorbing element.

12. The laser irradiation apparatus according to claim 1, wherein a reflecting mirror is provided over a surface of an optical-system module side of the first shield plate.

13. The laser irradiation apparatus according to claim 12, wherein a reflecting film applied to the reflecting mirror has a predetermined tolerance for an incident angle of the laser light.

14. The laser irradiation apparatus according to claim 1, wherein
the first shield plate comprises a horizontal part and a part inclined from the horizontal part toward the optical-system module, and the first reflected light includes reflected light, the reflected light being light that is generated as the laser light that has been applied to the first shield plate is reflected by the inclined part.

15. A method for manufacturing a semiconductor device comprising:
(A) emitting laser light from an optical-system module toward a substrate on which a film including a semiconductor is formed;
(B) providing a first shield plate in which a first slit is formed, through which the laser light passes, and making, out of the laser light applied to the first slit and the first shield plate, part of the laser light applied to the first slit pass through the first slit;
(C) blocking, out of the laser light applied to the first slit and the first shield plate, part of the laser light applied to the first shield plate by the first shield plate;
(D) disposing a reflected-light receiving component between the optical-system module and the first shield plate such that the reflected-light receiving component receives a first reflected light, the first reflected light being light that is generated as the laser light is applied to the first shield plate and reflected by the first shield plate; and
(E) irradiating the substrate with, out of the laser light applied to the first slit and the first shield plate, the laser light that has passed through the first slit,
wherein the first shield plate is bent toward the optical-system module.

16. The method for manufacturing a semiconductor device according to claim 15, further comprising:
(F) providing a second shield plate in which a second slit is formed, through which the laser light that has passed the first slit passes, and such that, out of the laser light applied to the second slit and the second shield plate, part of the laser light applied to the second slit passes through the second slit;
(G) blocking, out of the laser light applied to the second slit and the second shield plate, part of the laser light applied to the second shield plate by the second shield plate; and
(H) configuring the reflected-light receiving component so as to receive second reflected light, the second reflected light being light that is generated as the laser light that has been applied to the second shield plate is reflected by the second shield plate.

17. The method for manufacturing a semiconductor device according to claim 15, further comprising a step of making the reflected-light receiving component receive third reflected light, the third reflected light being light that is generated as the laser light that has been applied to the substrate is reflected by the substrate.

\* \* \* \* \*